United States Patent
Chen

(10) Patent No.: US 10,506,721 B2
(45) Date of Patent: Dec. 10, 2019

(54) ELECTRONIC MODULE CARD WITH BYPASS CAPACITOR

(71) Applicant: Sung-Yu Chen, Hsinchu (TW)

(72) Inventor: Sung-Yu Chen, Hsinchu (TW)

(*) Notice: Subject to any disclaimer, the term of this patent is extended or adjusted under 35 U.S.C. 154(b) by 0 days.

(21) Appl. No.: 16/194,546

(22) Filed: Nov. 19, 2018

(65) Prior Publication Data

US 2019/0191571 A1 Jun. 20, 2019

Related U.S. Application Data

(60) Provisional application No. 62/599,800, filed on Dec. 18, 2017.

(51) Int. Cl.
*H05K 3/34* (2006.01)
*H01L 23/00* (2006.01)
*G11C 5/06* (2006.01)
*G11C 11/407* (2006.01)

(52) U.S. Cl.
CPC ............ *H05K 3/34* (2013.01); *G11C 5/06* (2013.01); *G11C 11/407* (2013.01); *H01L 24/26* (2013.01)

(58) Field of Classification Search
CPC .............. H01L 24/26; H05K 3/34; G11C 5/06
See application file for complete search history.

(56) References Cited

U.S. PATENT DOCUMENTS

| | | | | |
|---|---|---|---|---|
| 3,396,461 | A * | 8/1968 | Spooner | H01B 1/00 29/827 |
| 6,719,570 | B2 * | 4/2004 | Tsuchioka | G06K 19/077 235/492 |
| 7,602,613 | B2 * | 10/2009 | Goodwin | G11C 5/04 174/254 |
| 8,951,048 | B2 * | 2/2015 | Seok | H05K 1/117 439/59 |
| 8,998,620 | B2 * | 4/2015 | Ni | H01R 12/71 361/737 |
| 10,257,934 | B2 * | 4/2019 | Mori | H05K 1/144 |

* cited by examiner

Primary Examiner — William H. Mayo, III
Assistant Examiner — Hiram E Gonzalez
(74) Attorney, Agent, or Firm — Li & Cai Intellectual Property (USA) Office

(57) ABSTRACT

An electronic module card with bypass capacitor includes a main board, an adhesive layer and a conduction skirting board. The main board has an inserting section and a plurality of solder pads disposed on a soldering region of the inserting section. At least one solder pad has a first extending part extending therefrom. The conduction skirting board is fixed to the inserting section, and has a rigid substrate and a plurality of conductive pads. Each conductive pad has an outer contacting part, and an adapting part. A gap is formed between the conduction skirting board and the main board. At least one conductive pad has a second extending part extended from the adapting part along an inner surface of the rigid substrate. A part of the second extending part is partially overlapped above a part of the first extending part so as to form a bypass capacitor.

10 Claims, 12 Drawing Sheets

ELECTRONIC MODULE CARD WITH BYPASS CAPACITOR

CROSS-REFERENCE TO RELATED PATENT APPLICATION

This application claims priority from the U.S. Provisional Patent Application Ser. No. 62/599,800 filed Dec. 18, 2017, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic module card with bypass capacitor, and more particularly to an electronic module card applied to high-frequency signals transmission, forming a bypass capacitor on metal pads of signals transmission to reduce noise interference.

BACKGROUND OF THE DISCLOSURE

Most memory module cards of a computer are Double Data Rate Synchronous Dynamic Random Access Memories (DDR SDRAM), which is an SDRAM with double data transmission rates. The data transmission rate is twice as fast as system time-pulse, different than SDR (Single Data Rate) which merely read/write once in a single period. The "Double" in DDR means that data is read/write twice in a single period. When the core clock rate remains the same, the transmission efficiency is double that of the SDR SDRAM.

Because of the high-frequency signals transmission, cross-talk noise interference is easily generated.

SUMMARY OF THE DISCLOSURE

In response to the above-referenced technical inadequacies, the present disclosure provides an electronic module card with bypass capacitor, which reduces noise interference, so as to improve the quality of high-frequency signal transmission.

In one aspect, the present disclosure provides an electronic module card with bypass capacitor, which includes a main board, an adhesive layer and a conduction skirting board. The main board has an inserting section and a plurality of solder pads. A surface of the inserting section is divided into a binding region and a soldering region. The solder pads are disposed on the soldering region. At least one of the solder pads has a first extending part extending therefrom. The adhesive layer is disposed on the binding region of the inserting section. The conduction skirting board is fixed on the inserting section correspondingly. Each of the conduction skirting boards has a rigid substrate and a plurality of conductive pads. Each of the conductive pads has an outer contacting part, and an adapting part. The outer contacting part is formed on an outer surface of the rigid substrate along an inserting direction. The adapting part passes through an outer surface and an inner surface of the rigid substrate, and connects the outer contacting part. The adapting parts of the conductive pads are soldered with the solder pads of the main board, respectively. A part of the rigid substrate without the conductive pad is fixedly connected to the binding region and the inserting section and the adhesive layer, so as to form a gap between the conduction skirting board and the main board. At least one of the conductive pads has a second extending part extending from the adapting part along an inner surface of the rigid substrate, and a part of the second extending part is overlapped above a part of the first extending part.

The instant disclosure has the following advantages. The present disclosure can reduces noise interference by the bypass capacitor formed of the second extending part and the first extending part in a partially-overlapped state to improve the transmission quality of high-frequency signals. In addition, the electronic module card structure of the present disclosure has a conduction skirting board, which can reduces the thickness of the main board, so as to reduce the total thickness of the electronic module card structure. Therefore, two adjacent ones of the electronic module card structure form a bigger gap for dissipating redundant heat which benefits the high-speed transmission of signals.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
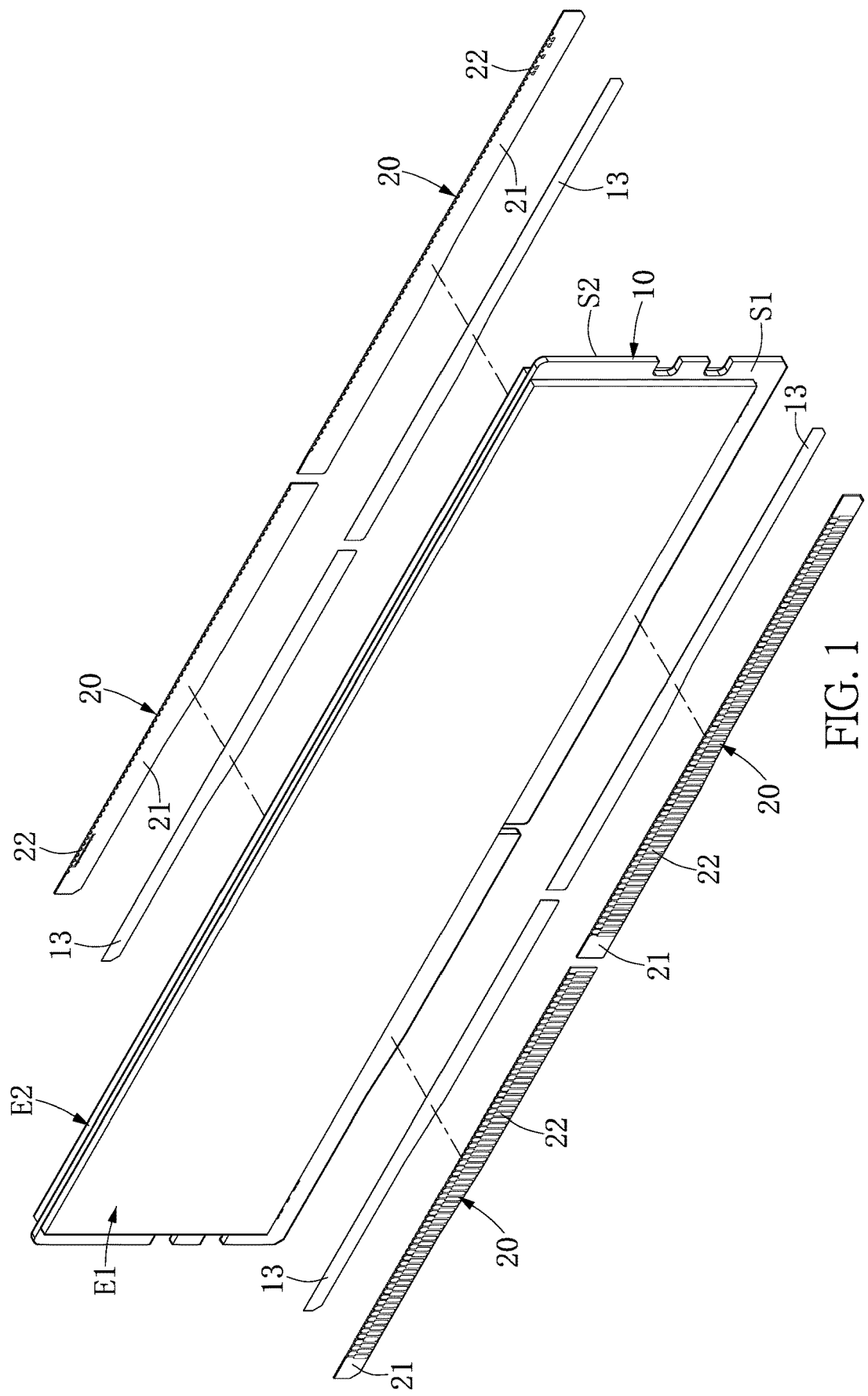
FIG. 1 is an exploded view of an electronic module card with a bypass capacitor of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
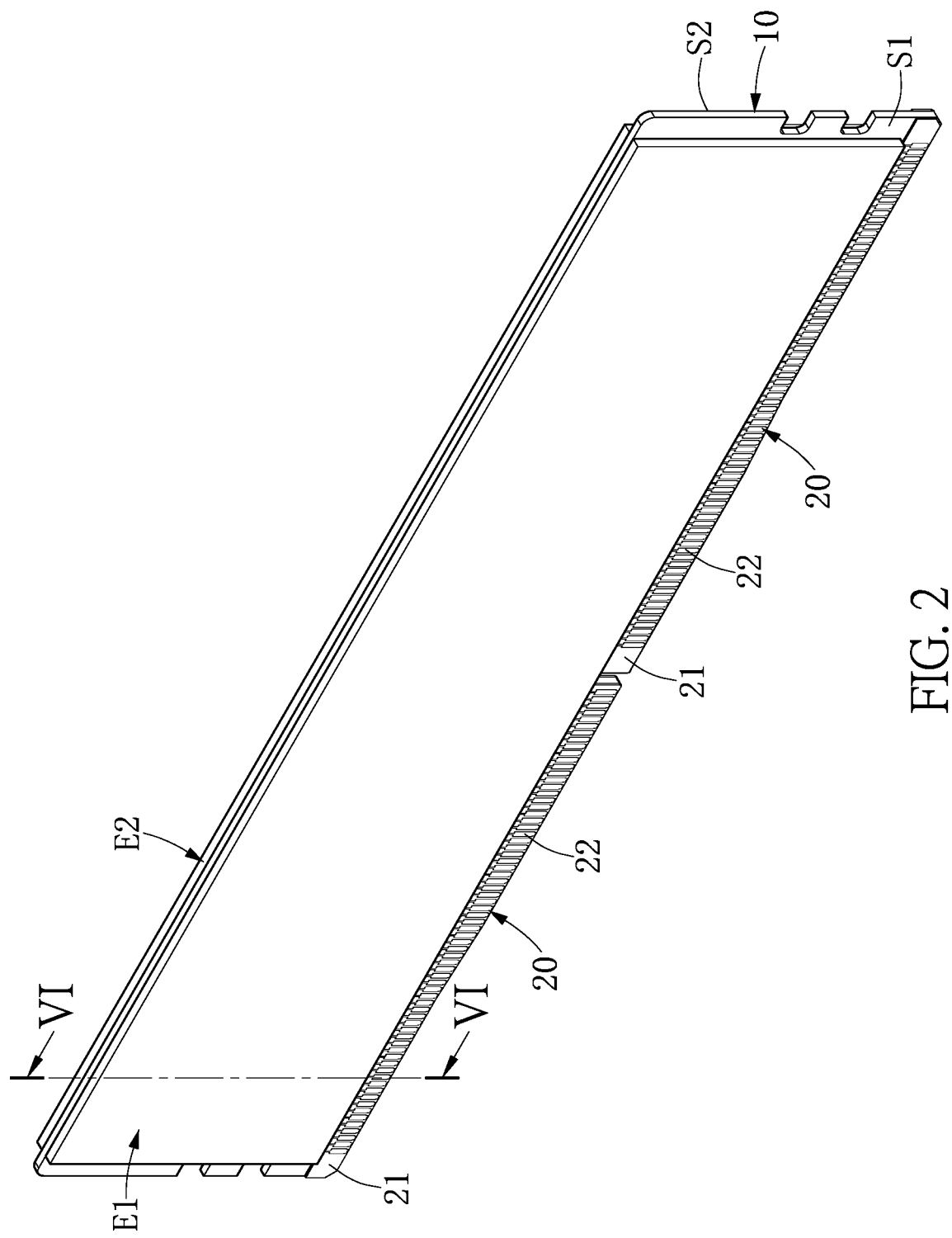
FIG. 2 is an assembled perspective view of the electronic module card with a bypass capacitor of the present disclosure.
Figure 3:
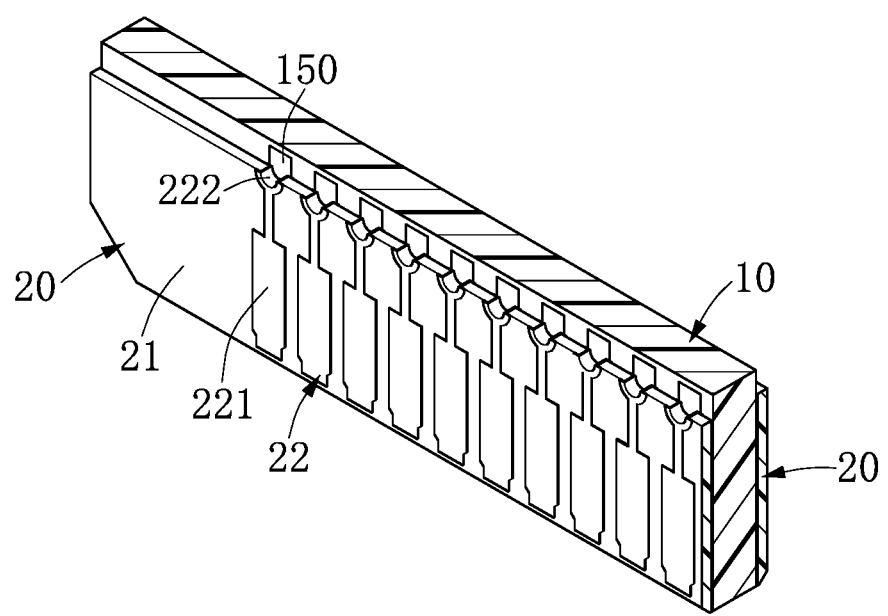
FIG. 3 is a partial-enlarged assembled perspective view of an inserting section of the electronic module card of the present disclosure.

Reference is made to FIG. 1 to FIG. 3. The present disclosure provides an electronic module card structure with bypass capacitor, or an electronic module card structure, which includes a main board 10, a plurality of adhesive layers 13 and a plurality of conduction skirting boards 20. The number of the adhesive layers 13 matches with that of the conduction skirting board 20. The conduction skirting board 20 is electrically connected to the main board 10 and affixed to the main board 10 by an adhesive layer 13. The details of the electrical connection will be introduced later.

Figure 4:
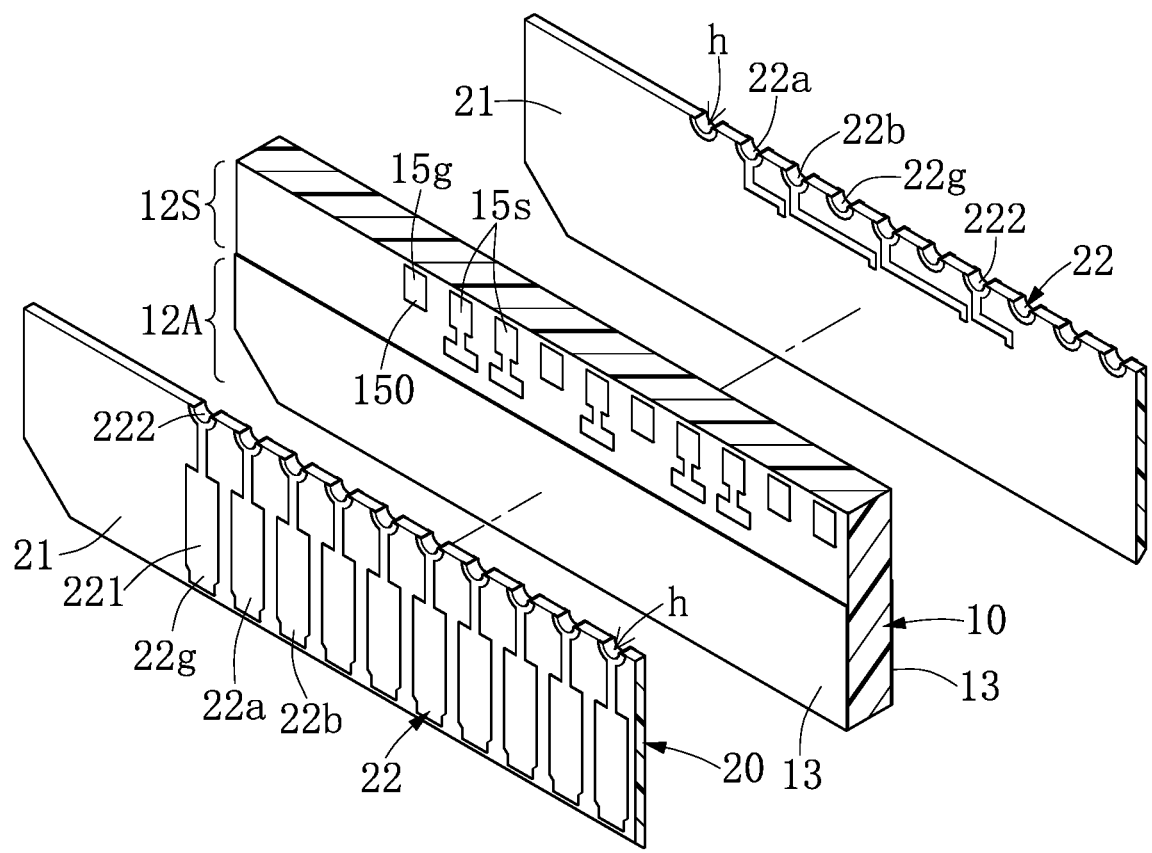
FIG. 4 is a partially-enlarged exploded view of the inserting section of the electronic module card of the present disclosure.
Figure 5:
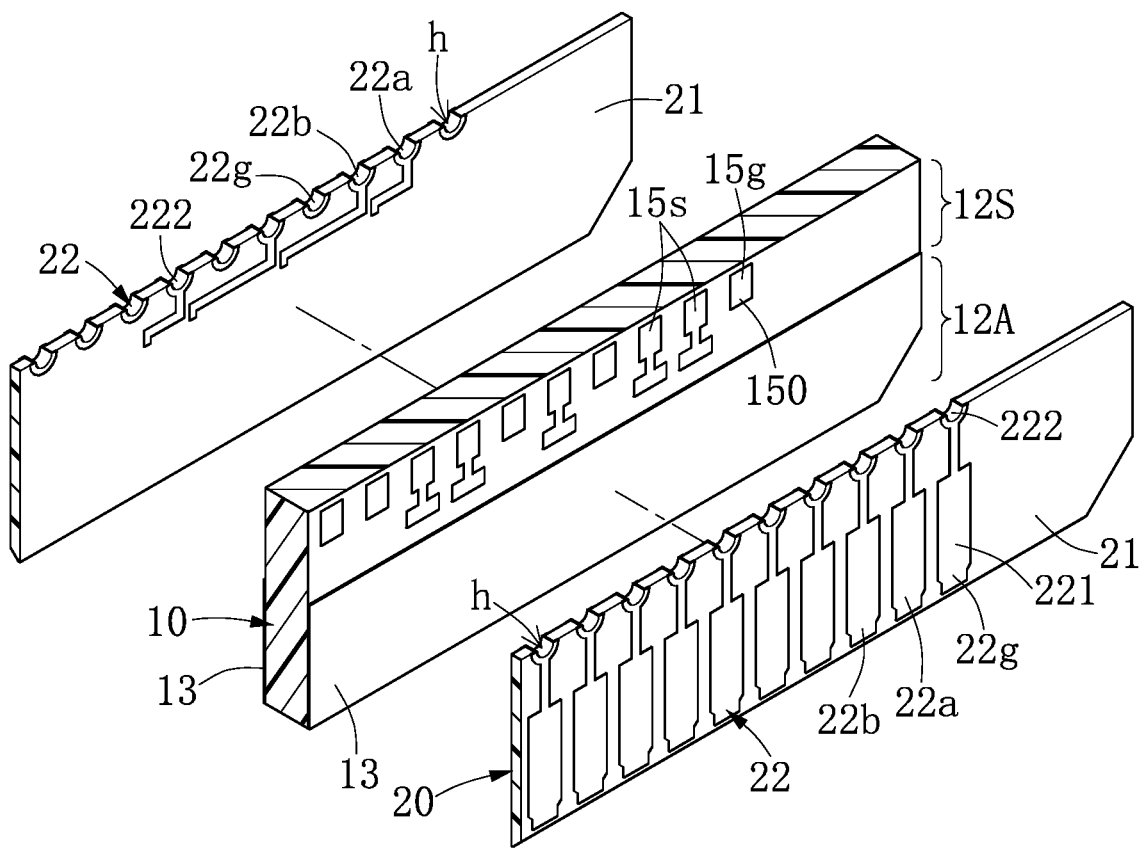
FIG. 5 is another partially-enlarged exploded view of the inserting section of the electronic module card of the present disclosure.

The main board 10 has a first surface S1 and a second surface S2. The first surface S1 and the second surface S2 are respectively divided into a mounting section 11 and an inserting section 12. In other words, the electronic module card structure has a first component layer E1 disposed on the mounting section 11 of the first surface S1, and a second component layer E2 disposed on the mounting section 11 of the second surface S2, which allow a plurality of electronic elements mounted thereon, such as memory chips . . . etc. The inserting section 12 of the electronic module card structure is used to insert into an electrical connector, such as a memory socket (not shown), along an inserting direction. The first surface S1 and the second surface S2 respectively have one inserting section 12. As shown in FIG. 4 and FIG. 5, each of the inserting sections 12 is further divided in a binding region 12A and a soldering region 12S. The soldering region 12S is close to the mounting section 11, and the binding region 12A is close to a bottom edge of the electronic module card structure, that is, close to an inserting end of the electronic module card structure. The soldering region 12S has a plurality of solder pads 150, and a plurality of solder pads 150 electrically connected to the mounting section 11. The solder pads 150 are electrically connected to the electronic elements on the mounting section 11, which can be achieved by the technology of multi-layer printed circuit board with vias, such as a buried via hole, or a blind via hole. Such structure is known to those skilled in the art, and will not be described.

As shown in FIG. 1 and FIG. 4, this embodiment has four adhesive layers 13, but the present disclosure is not limited thereto, and the number can be at least one. The adhesive layer 13 is disposed on the binding region 12A of the inserting section 12, and the conduction skirting board 20 fixedly adheres to the main board 10. The adhesive layer 13 is made of insulative material, such as hot-melt adhesive.

This embodiment has four conduction skirting boards 20, but the present disclosure is not limited thereto, and the number can be at least one. The conduction skirting boards 20 are correspondingly attached to the inserting sections 12. Each conduction skirting board 20 has a rigid substrate 21 and a plurality of conductive pads 22. The rigid substrate 21 is made of rigid board, such as glass fiber. Each conductive pad 22 has an outer contacting part 221, and an adapting part 222. The outer contacting parts 221 are disposed on an outer surface of the rigid substrate 21 along the inserting direction, and are commonly referred to as "gold fingers". The adapting part 222 passes from an outer surface to an inner surface of the rigid substrate 21, and is connected to the outer contacting part 221. In this embodiment, the adapting part 222 is shaped in a half cylinder, and has one semi-ring part extending to an outer surface of the rigid substrate 21, and another semi-ring part extending to an inner surface of the rigid substrate 21.

Concerning the method of manufacturing the conduction skirting board 20, the method of manufacturing a rigid PCB can be adopted, which etches a copper clad laminate. The number of the conductive pads 22 of the conduction skirting board 20 is matched with that of the solder pads 150 of the main board 10.

Reference is made to FIG. 3 to FIG. 5. An exemplary combining process of this embodiment is introduced as follows. The adapting parts 222 of the conductive pad 22 are correspondingly electrically connected to the solder pads 150. A part of the rigid substrate 21 is fixed to the binding region 12A of the inserting section 12 by the adhesive layer 13. For example, the adhesive layer 13 can be sprayed on the main board 10, and the solder pads 150 of the main board 10 are sprayed with solder S. Then, the conduction skirting board 20 is disposed on the inserting section 12 of the main board 10. Finally, the adapting parts 222 and the solder pads 150 are soldered together by a reflow oven.

As shown in FIG. 4, the adapting parts 222 of the conductive pad 22 can be made by the VIA (vertical interconnect access) technology. The rigid substrate 21 is formed with a plurality of through holes h which pass through an inner surface and an outer surface of the rigid substrate 21. The adapting parts 222 can be formed on the periphery of the through hole h by an electroplating process.

Figure 7:
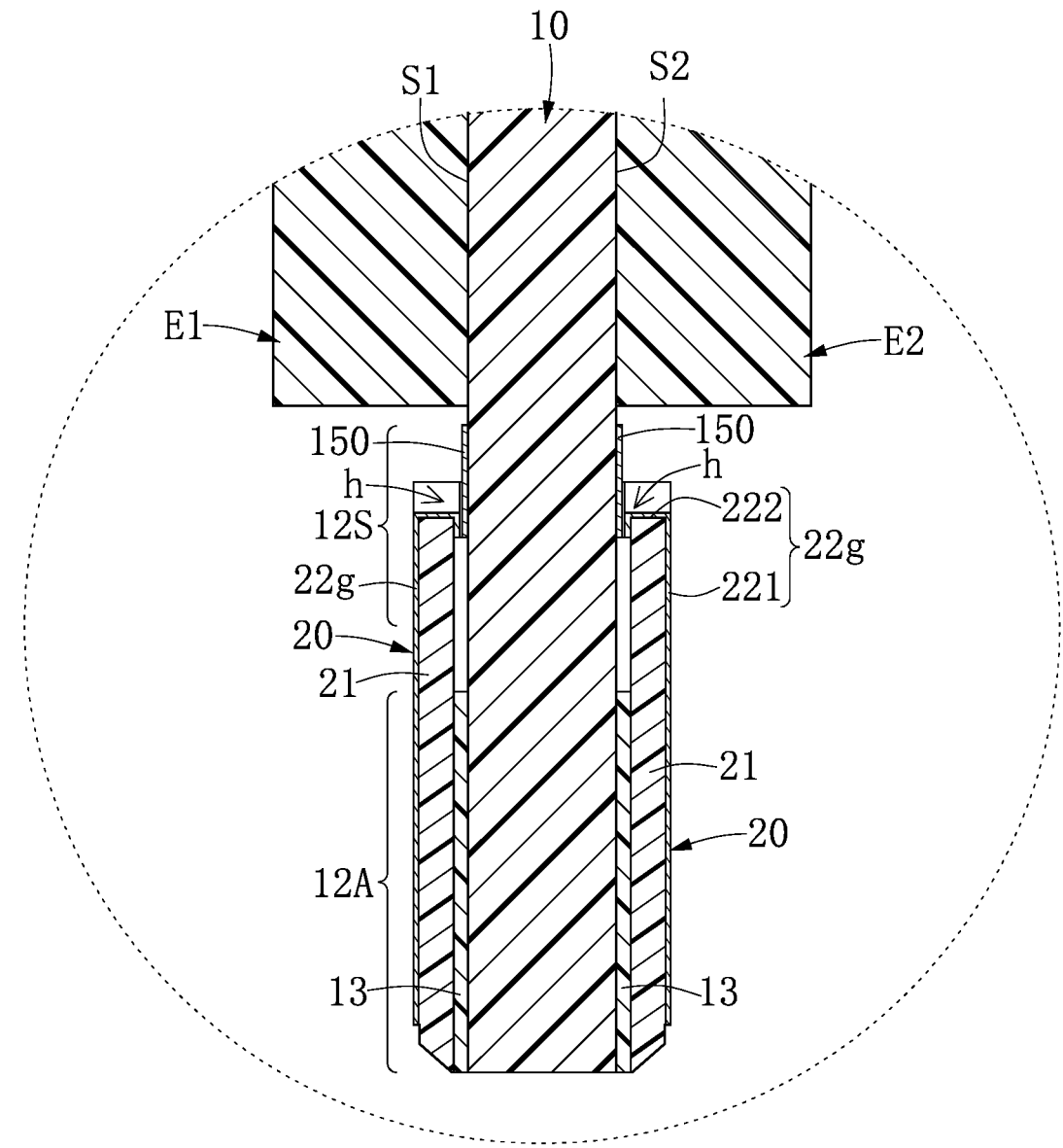
FIG. 7 is a partially-enlarged cross-sectional view of the electronic module card with a bypass capacitor of the present disclosure.
Figure 8:
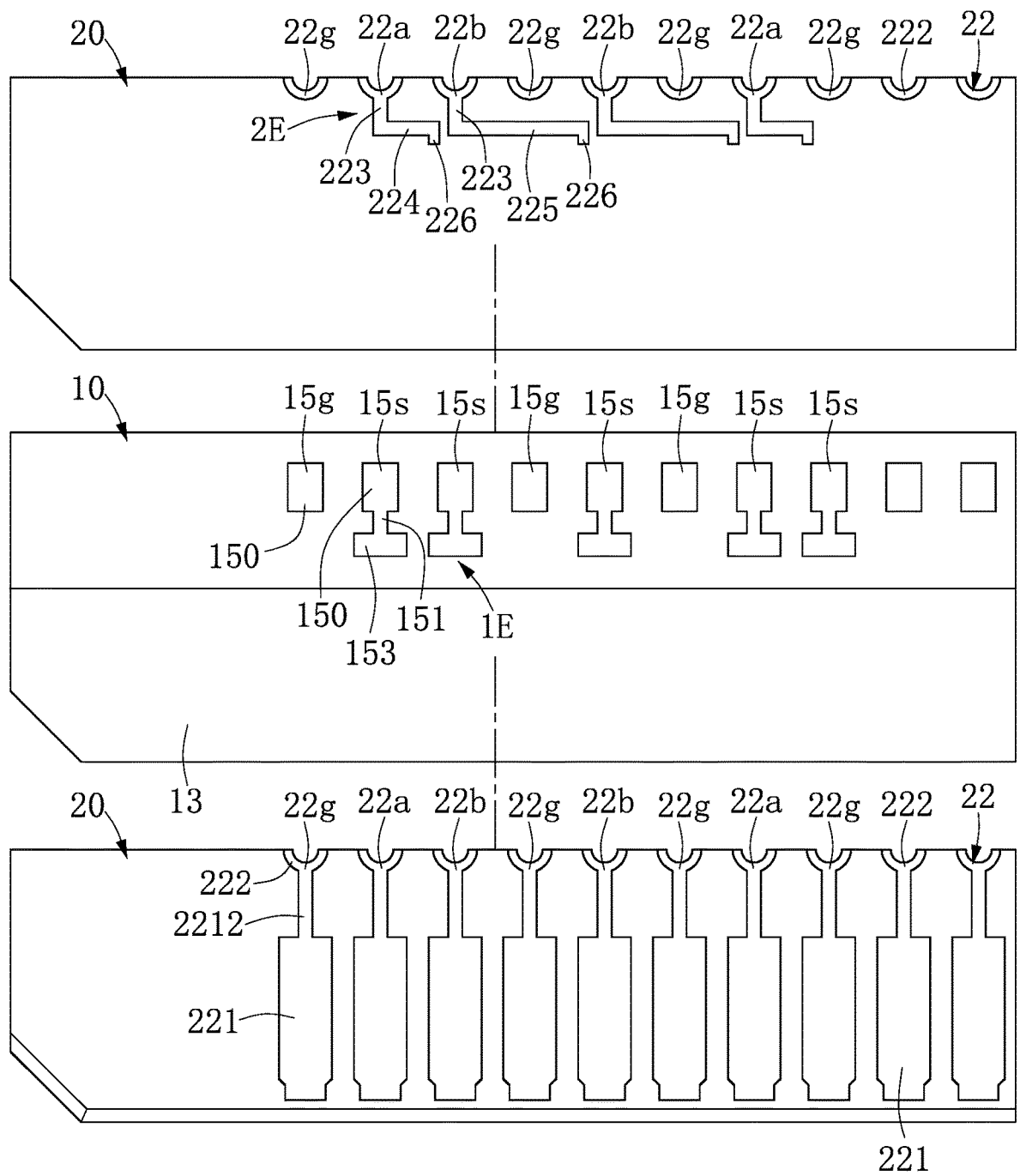
FIG. 8 is a front partially-enlarged cross-sectional view of the inserting section of the electronic module card of the present disclosure.

Reference is made to FIG. 7 and FIG. 8. The electronic module card structure with bypass capacitor of this embodiment, a part of the rigid substrate 21 without the conductive pad 22 is fixed to the binding region 12A of the inserting section 12 by the adhesive layer 13, and a gap C is formed between the conduction skirting board 20 and the main board 10. The at least one solder pad 150 of the main board 10 has a first extending part 1E extended therefrom. The at least one conductive pad 22 has a second extending part 2E extended from the adapting part 222 along an inner surface of the rigid substrate 21. A part of the second extending part 2E is overlapped above a part of the first extending part 1E, so as to form a bypass capacitor. The bypass capacitor can filter out high-frequency noise in inputting signals, and specifically filter out the preloaded high-frequency noise. Therefore, the present disclosure provides functions of anti-interference or noise-reduction. The structure is further illustrated in detail with examples as follows.

According to a functional formula of FEXT (Far-End Crosstalk, FEXT):

FEXT α Cm/C−Lm/L;

Wherein Cm is mutual capacitance; C is self-capacitance; Lm is mutual inductance; L is self-inductance. This embodiment can reduce noise interference.

As shown in FIG. 4, FIG. 5, and FIG. 8, wherein the conductive pad 22 of the electronic module card structure with bypass capacitor is a general term of conductive pad electrically connected with the main board 10. The conductive pad 22 further includes grounded conductive pads 22g, or signal-transmitting conductive pads 22a, 22b. Each of the signal-transmitting conductive pads 22a, 22b has a second extending part 2E. An outer transitional part 2212 is connected between the outer contacting part 221 and the adapting part 222. A width of the outer transitional part 2212 is smaller than a width of the outer contacting part 221.

Taking the signal-transmitting conductive pad 22a as an example, the second extending part 2E has an inner transitional part 223, and a transverse transitional part 224. The inner transitional part 223 extends along the extending direction of the outer transitional part 2212. The transverse transitional part 224 curvedly connects to the inner transitional part 223 and extends transversely to an adjacent one of the first extending parts 1E. In this embodiment, a width of the transverse transitional part 224 is substantially equal to a width of the inner transitional part 223.

Figure 5A:
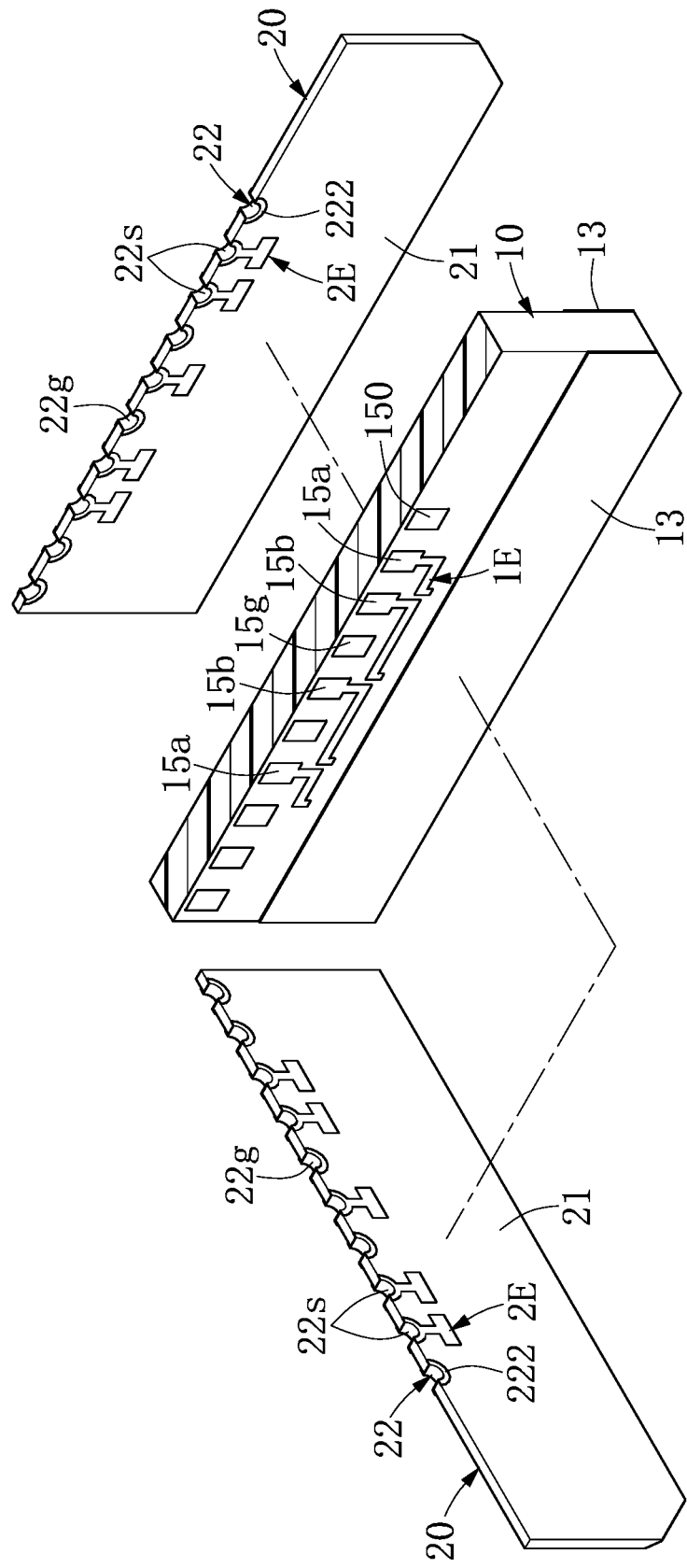
FIG. 5A is a partially-enlarged exploded view of the inserting section of the electronic module card of a right part in FIG. 1 of the present disclosure.
Figure 6:
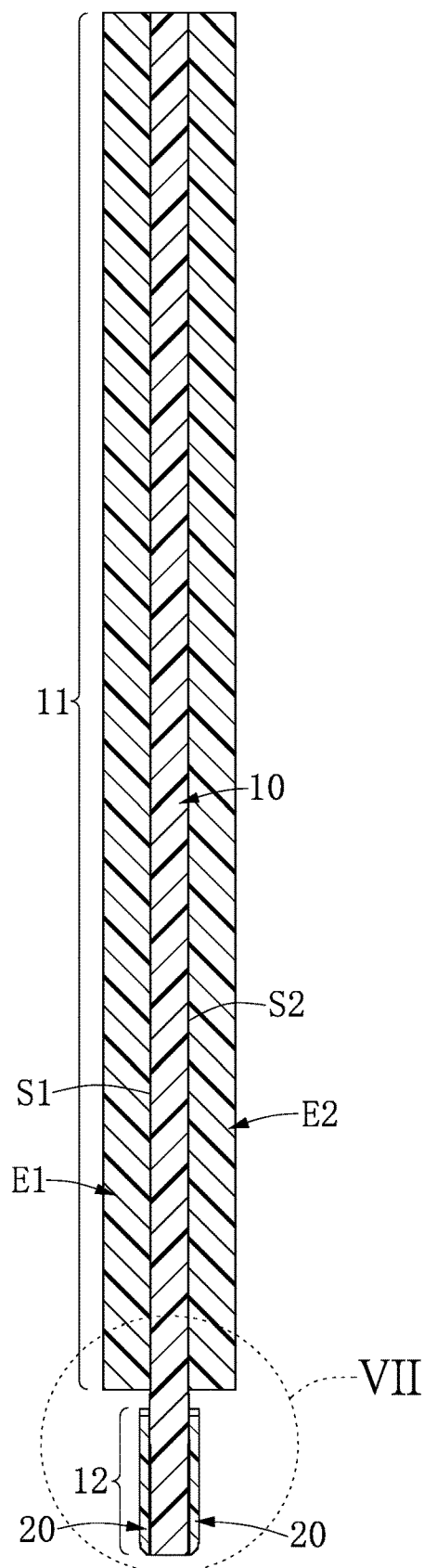
FIG. 6 is a cross-sectional view of the electronic module card with a bypass capacitor of the present disclosure.

In addition, shapes of the first extending part 1E and the second extending part 2E are only examples in one exemplary embodiment, and drawings of the embodiment only illustrate necessary features in concept, but the present disclosure is not limited thereto. For example, reference is made to FIG. 5A, which is a partially-enlarged right side of FIG. 1. The second extending part 2E on the rigid substrate 21 can be substantially in the shape of an inverted-T, and generally includes grounded conductive pad 22g and signal-transmitting conductive pad 22s. The first extending part 1E on the main board 10 can be substantially in L-shaped, and includes grounded pad structure 15g or signal-transmitting pad structures 15a, 15b.

Figure 9:
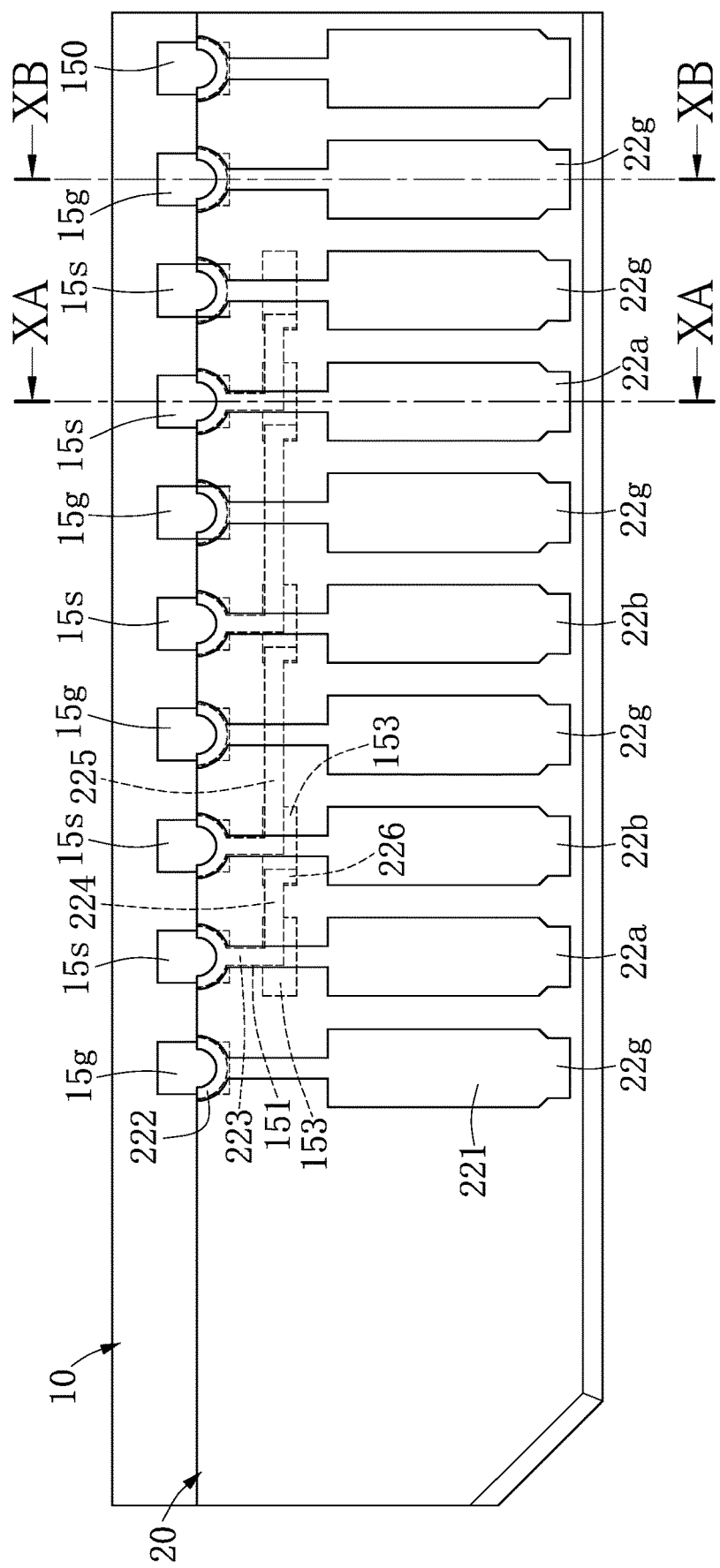
FIG. 9 is a front partially-enlarged assembled view of the inserting section of the electronic module card of the present disclosure.

Reference is made to FIG. 8 and FIG. 9. To correspond with different types of the conductive pad 22g, 22a, 22b, the solder pads on the main board 10, which are electrically connected to the conduction skirting board 20, can be divided into ground-type pad structures 15g or signal-transmitting pad structures 15s. The pad structure 15s for transmitting signals has a first extending part 1E. The first extending part 1E has a strip part 151 and an enlarged part 153. The strip part 151 is parallel to the inner transitional part 223 of the second extending part 2E. The width of the strip part 151 is substantially equal to that of the inner transitional part 223. The position of the enlarged part 153 corresponds to where between the adapting part 222 and the outer contacting part 221. The enlarged part 153 extends from the strip part 151 along a direction from the adapting part 222 toward the outer contacting part 221.

The enlarged part 153 of the conduction skirting board 20 has a width larger than that of the solder pad 150, and substantially equal to the width of the outer contacting part 221.

The second extending part 2E further includes an inner inductive part 226. The inner inductive part 226 is curvedly extended from the transverse transitional part 224. A part of the enlarged part 153 of the first extending part 1E is overlapped above the inner inductive part 226, so as to form the above-mentioned bypass capacitor. A length of the inner inductive part 226 along the inserting direction is substantially equal to a length of the enlarged part 153 along the inserting direction.

Furthermore, in this embodiment, the conductive pad 22b of another signal-transmitting type has a transverse transitional part 225 which extends across an adjacent grounding one of the conductive pads 22g and is close to another signal-transmitting one of the conductive pads 22a. In other words, the transverse transitional part 225 is close to another one of the transverse transitional parts 224 of another one of the conductive pads 22a. Alternatively, as shown in FIG. 8, the transverse transitional parts 225 of the conductive pad 22b at the left side extends across the transverse transitional part 225 of an adjacent one of the conductive pad 22g, that is, to be close to another one of the transverse transitional parts 225 of conductive pad 22b.

Figure 10A:
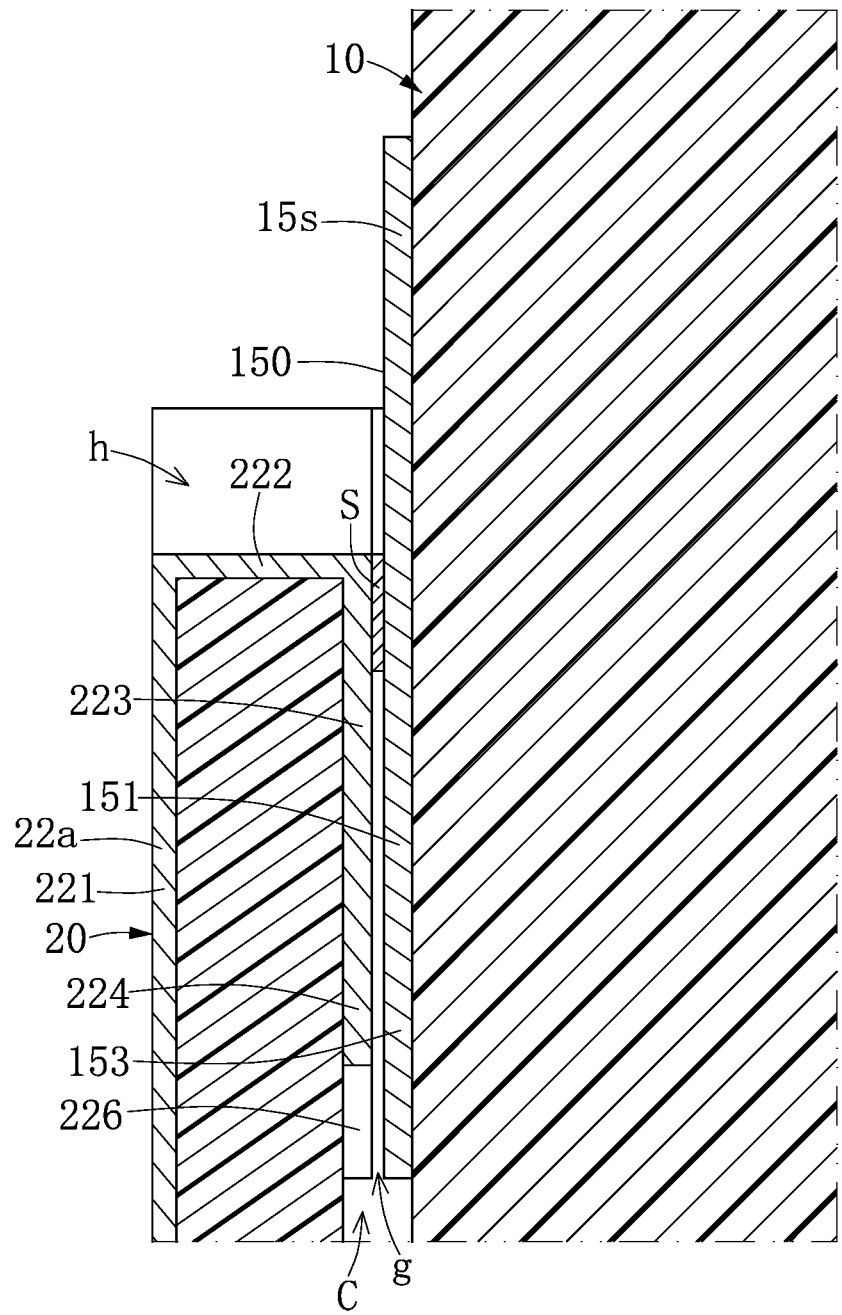
FIG. 10A is a cross-sectional view taken along the XA-XA line in FIG. 9 of the present disclosure.
Figure 10B:
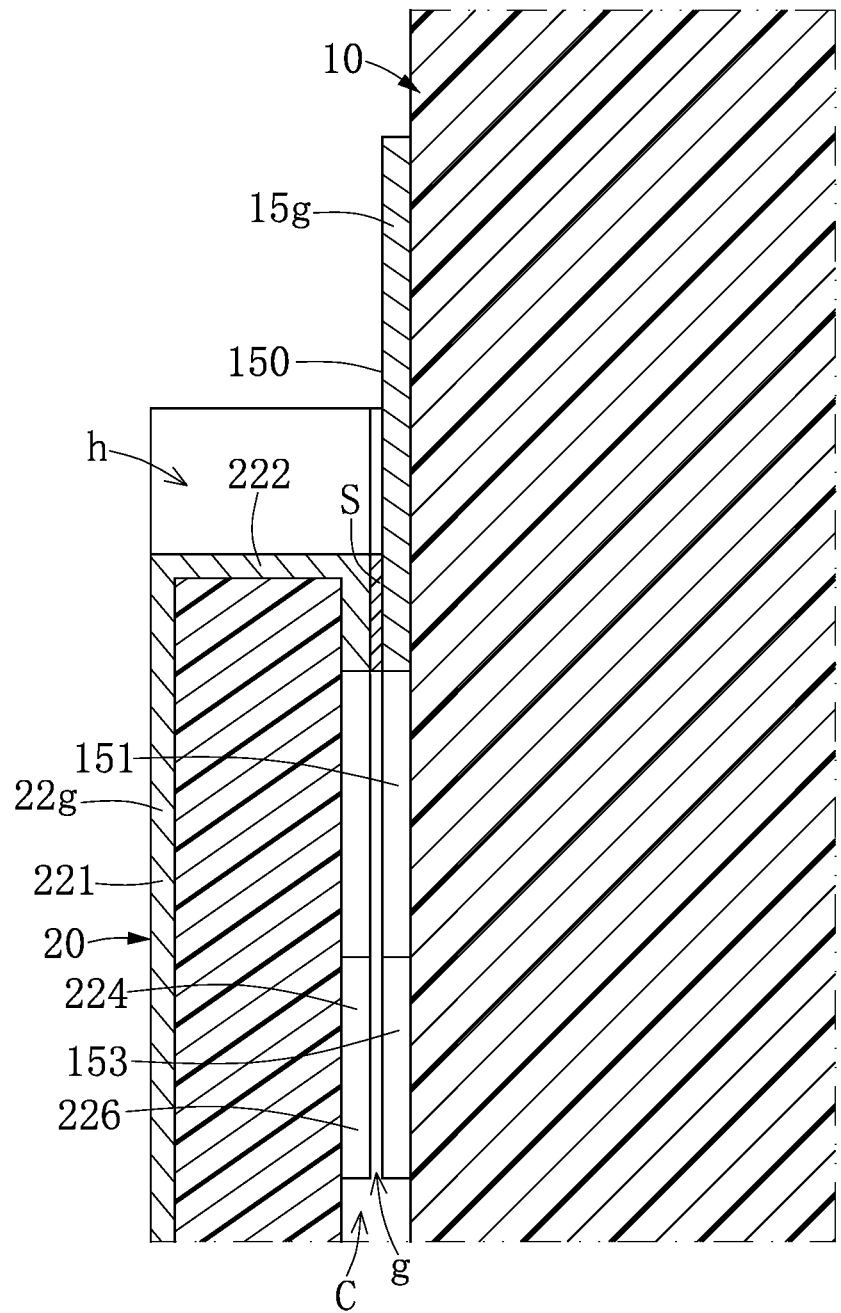
FIG. 10B is a cross-sectional view taken along the XB-XB line in FIG. 9 of the present disclosure.

Reference is made to FIG. 10A and FIG. 10B. A spacing distance g between a part of the second extending part 2E overlapped between a part of the first extending part 1E is not larger than the gap C. The gap C is not larger than 0.15 mm. The spacing thickness g extends along a direction of a normal line vector of the first surface S1 or the second surface S2 of the main board 10. In this embodiment, as shown in FIG. 10A and FIG. 10B, the thickness of the conductive pad is only illustrated schematically for the purpose of clearly illustrating the conductive pads (22a, 22g). The actual thickness of the conductive pad is not as distinguishable as that shown in the figures.

On the other hand, the spacing thickness g between a part of the second extending part 2E overlapping a part of the first extending part 1E is smaller than a trace distance between any adjacent two of the first extending parts 1E. The trace distance, for example, the leftmost conductive pad 22a and conductive pad 22b in FIG. 9, the two inner transitional parts 223 are parallel to each other and have a larger trace distance therebetween. The minimum trace distance between the conductive pad 22a and the conductive pad 22b is located between the inner inductive part 226 of the conductive pad 22a and the inner transitional part 223 of the conductive pad 22b. Similarly, the minimum trace distance between two adjacent conductive pads 22b is located between the inner inductive part 226 and the inner transitional part 223.

In conclusion, the features and effectiveness of the instant disclosure are that, a bypass capacitor is formed between a part of the second extending part overlapped over a part of the first extending part, so as to reduce noise interference and improve the quality of high-frequency signals transmission. In addition, the electronic module card structure is equipped with the conduction skirting board, which lowers the thickness of the main board, so as to lower the total thickness of the electronic module card structure. Therefore, two adjacent electronic module card structures have a larger gap for dissipating redundant heat, which benefits the high-speed transmission of signals.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic module card with bypass capacitor, comprising:
    a main board including an inserting section and a plurality of solder pads, a surface of the inserting section being divided into a binding region and a soldering region, the solder pads being disposed on the soldering region, and at least one of the solder pads having a first extending part extending therefrom;
    an adhesive layer disposed on the binding region of the inserting section; and
    a conduction skirting board correspondingly fixed to the inserting section, the conduction skirting board having a rigid substrate and a plurality of conductive pads, each of the conductive pad having an outer contacting part, and an adapting part; the outer contacting part disposed on an outer surface of the rigid substrate along an inserting direction; the adapting part passing through the outer surface to an inner surface of the rigid substrate, and connecting to the outer contacting part;
    wherein the adapting parts of the conductive pads are respectively and electrically connected to the solder pads of the main board, a part of the rigid substrate without the conductive pad is fixedly connected to the binding region and the inserting section and the adhesive layer, so as to form a gap between the conduction skirting board and the main board;
    wherein at least one of the conductive pads has a second extending part extending from the adapting part along an inner surface of the rigid substrate, and a part of the second extending part is overlapped above a part of the first extending part.

2. The electronic module card with bypass capacitor according to claim 1, wherein an outer transitional part is connected between the outer contacting part and the adapting part, and a width of the outer transitional part is smaller than that of the outer contacting part.

3. The electronic module card with bypass capacitor according to claim 2, wherein the second extending part has an inner transitional part, and a transverse transitional part, the inner transitional part extends along an extending direction of the outer transitional part, and the transverse transitional part is curvedly connected to the inner transitional part and extends transversely to an adjacent one of the first extending parts.

4. The electronic module card with bypass capacitor according to claim 3, wherein the first extending part of the main board includes a strip part and an enlarged part, the strip part is parallel to the inner transitional part, and the enlarged part extends from the strip part along a direction from the adapting part to the outer contacting part.

5. The electronic module card with bypass capacitor according to claim 4, wherein a width of the enlarged part of the first extending part is larger than a width of the solder pad, and is substantially equal to a width of the outer contacting part.

6. The electronic module card with bypass capacitor according to claim 4, wherein the second extending part further includes an inner inductive part, the inner inductive part is curvedly extended from the transverse transitional part, and a part of the enlarged part of the first extending part overlaps above the inner inductive part.

7. The electronic module card with bypass capacitor according to claim 2, wherein the transverse transitional part of the conductive pad extends across an adjacent one of the conductive pads to be close to the transverse transitional part of another adjacent one of the conductive pad.

8. The electronic module card with bypass capacitor according to claim 1, wherein a spacing thickness between a part of the second extending part overlapping above a part of the first extending part is smaller than a trace distance between any adjacent two of the first extending parts.

9. The electronic module card with bypass capacitor according to claim 1, wherein the distance of the gap is not larger than 0.15 millimeters.

10. The electronic module card with bypass capacitor according to claim 9, wherein a spacing thickness between a part of the second extending part overlapping above a part of the first extending part is not larger than the gap.

* * * * *